United States Patent [19]

Eschbach

[11] Patent Number: 5,312,509

[45] Date of Patent: May 17, 1994

[54] MANUFACTURING SYSTEM FOR LOW TEMPERATURE CHEMICAL VAPOR DEPOSITION OF HIGH PURITY METALS

[75] Inventor: Rudolph J. B. Eschbach, Amenia, N.Y.

[73] Assignee: International Business Machines Corporation, Armonk, N.Y.

[21] Appl. No.: 880,838

[22] Filed: May 11, 1992

Related U.S. Application Data

[63] Continuation-in-part of Ser. No. 516,847, Apr. 30, 1990, abandoned.

[51] Int. Cl.⁵ .............................................. H05H 1/00
[52] U.S. Cl. ................................ 156/345; 156/643; 118/719; 118/723 ME; 118/724; 118/725; 118/723 MR; 427/585; 427/250; 427/255.7; 427/307
[58] Field of Search .................. 156/643, 646, 345; 118/719, 723, 724, 725; 427/250, 255.7, 255.2, 307, 585, 405

[56] References Cited

U.S. PATENT DOCUMENTS

| | | | |
|---|---|---|---|
| 3,729,335 | 4/1973 | Domrachev et al. | 117/95 |
| 4,617,087 | 10/1986 | Iyer et al. | 156/643 |
| 4,619,844 | 10/1986 | Pierce et al. | 118/725 X |
| 4,620,984 | 11/1986 | Hoddinott | 427/9 |
| 4,636,401 | 1/1987 | Yamazaki et al. | 427/39 |
| 4,673,588 | 6/1987 | Bringmann et al. | 427/41 |
| 4,763,602 | 8/1988 | Madan et al. | 118/719 |
| 4,798,167 | 1/1989 | Ishihara et al. | 118/723 |
| 4,803,947 | 2/1989 | Ueki et al. | 418/719 |
| 4,817,557 | 4/1989 | Diem et al. | 118/719 |
| 4,824,545 | 4/1989 | Arnold et al. | 204/298 |
| 4,842,891 | 6/1989 | Miyazaki et al. | 427/35 |
| 5,030,319 | 7/1991 | Nishino et al. | 156/643 X |
| 5,174,881 | 12/1992 | Iwasaki et al. | 156/345 X |

FOREIGN PATENT DOCUMENTS 297348 1/1989 European Pat. Off. .

*Primary Examiner*—Thi Dang
*Attorney, Agent, or Firm*—Graham S. Jones, II

[57] ABSTRACT

An automatic manufacturing system receives a semiconductor substrate with etched patterns, loads it onto a chuck in a chamber which is then evacuated. Plasma etching cleans the substrate, then coated with adhesion and nucleation seed layers. A reactor selectively connected, adjacent to the chamber sublimes a precursor of the metal, which is then transported to the substrate. A reactor heat transfer system provides selective reactor cooling and heating above and below the precursor sublimation temperature under the control of programmable software. The heated chuck heats the substrate above the dissociation temperature of the precursor, releasing the metal from the precursor onto the substrate to nucleate the metal species onto the seed layer on the substrate. Then the system is pumped to a lower pressure after expiration of each period of sublimation, and the substrate is advanced to the next chamber, released from the chuck and returned to its original cassette.

16 Claims, 2 Drawing Sheets

MANUFACTURING SYSTEM FOR LOW TEMPERATURE CHEMICAL VAPOR DEPOSITION OF HIGH PURITY METALS

RELATED U.S. APPLICATION

This is a continuation-in-part Application of copending application Ser. No. 07/516,847 filed on Apr. 30, 1990, now abandoned.

BACKGROUND OF THE INVENTION

1. Field of the Invention

This invention relates to an automatic system for performing in situ a process of low temperature chemical vapor deposition of high purity metals.

2. Description of Related Art

There is need for a system for depositing CVD copper metallurgy on semiconductor wafers. This requirement is coupled with the limitations and problems of present technology of metallurgy in semiconductor chip wiring, interlevel connection (studs), electromigration, and circuit speed.

A currently available commercial metal sputter deposition system employs a specially designed reaction/deposition chamber on a sputter system as a manufacturing type system to replace aluminum-copper and other metals with pure copper by using chemical vapor deposition (CVD) as the transport mechanism to fill via holes, wiring lines, and interconnection studs.

Existing approaches to the present metallurgy and delivery systems are: to vary the copper percentage in the aluminum-copper; the use of barriers to stop electromigration; the use of other metals such as tungsten for studs; the use of evaporation, PIB (Partially Ionized Beam), ECR (Electron Cyclotron Resonance), and sputtering to fill the same topography. At present there appears to a need for a system to deposit CVD copper. However it is known how to deposit tungsten by CVD techniques. The system for copper is very different in design of equipment and process technology.

The Beach et al U. S. patent application Ser. No. 68,695 filed Jun. 30, 1987 and United Kingdom Application Number 88109444.5, published in the United Kingdom as Publication No. 0 297 348 published Jan. 4, 1989 for "Method for Chemical Vapor Deposition of Copper, Silver and Gold Using a Cyclopentadienyl Metal Complex" describes using CVD deposition of copper to form semiconductor chip metallization using thermal CVD (with a thermal reactor.) The, reactor heats a precursor compound carrying the copper causing the compound to dissociate leaving the copper metal behind, to deposit on the substrate. A simple reactor is shown with the substrate 24 suspended above the compound 30 which sublimes.

The steps outlined in the Beach et al application are as follows:

a) a vacuum of 0.001 Torr is applied to the chamber carrying the substrate to clean the reactor,
b) the pressure is raised to 0.1 Torr.
c) the external walls of reactor 10 are heated to about 70° C. while the reactor can be evacuated by a trapped diffusion pump.
d) the substrate is heated to about 150°-220° C.
e) the compound 30 sublimes and vapors rise to the substrate where the gaseous precursor decomposes depositing metal upon the substrate.

In example I in Beach et al, a water ice bath is placed about the reactor in FIG. 1 of Beach et al, initially. Then the substrate holder is heated to 215° C. and the ice bath is replaced by the 70° C. bath, yielding a copper deposit almost immediately upon a substrate of silicon with a Cr adhesion film on the surface.

Patents which relate to CVD reactors and metal have been found, as follows:

U.S. Pat. No. 4,388,342 of Suzuki et al for a method for CVD describes supplying an auxiliary gas which contains the gaseous compound into the reaction chamber to compensate for the consumed gaseous compound in the reaction chamber in response to the measurement of the concentration of the gaseous compound; U.S. Pat. No. 4,503,807 by Nakayama et al for CVD apparatus describes loading chamber and reactor; separate-automatic cassette loading; U.S. Pat. No. 4,636,401 of Yamazaki et al describes an energy and gas flow system; U.S. Pat. No. 4,607,591 of Spitz for a CVD heater control circuit—describes temperature sensor for control of wafer heater by feedback; U.S. Pat. No. 4,596,208 by Wolfson et al for a CVD reaction chamber—describes a reaction chamber and thermocouple for reading temperature.

THE PROBLEM

The problem is to design apparatus for filling high aspect ratio trenches and via holes with conductor metallization where the aspect ratio is greater than 1, especially with a low temperature dielectric such as polyimide using a CVD process such as the Beach et al process of application Ser. No. 68,695, above.

What is required is deposition of pure copper at low temperatures to fill high aspect ratio holes and lines without seams and/or voids. Currently commercially available means of hole filling, such as evaporation and sputtering, leave voids in the copper and seams because of the intrinsic nature of the very processes employed and the topography which the deposited copper must fill.

The importance of pure copper wiring and interconnection studs is both one of speed and reliability in the chip circuitry. Copper metallurgy for a manufacturing process is sought by the semiconductor industry as it offers high speed and more reliability along with higher density packaging because of the hole fill characteristics of the CVD process.

SUMMARY of NOVEL FEATURES OF CONCEPT

The present system for chemical vapor deposition of pure copper at low temperatures fills holes and lines without seams and/or voids.

Chemical vapor deposition deposits on all surfaces at approximately the same rate (conformal deposition) and has been demonstrated to fill high aspect ratio holes without sidewall voiding and formation of seams at the centers of holes.

Employing equipment in accordance with this invention, precleaning of the designed surfaces of a work piece to be coated is accomplished by an RF cleaning step, an adhesion barrier layer is applied to the work by sputter deposition, (a sputtered seed layer if required) and the CVD copper deposition is practiced, all steps being performed in an in situ environment.

Alternatives to this solution are to use other means of material delivery such as evaporation, sputtering, PIB and ECR which have proven to be less successful in that they leave voids and seams in the hole and lines.

Metallization can be applied by CVD deposition onto a wafer which has been patterned for electrical circuits using the materials in the Beach et al application, supra, and subsequent materials. A tantalum adhesion/barrier layer is first sputter deposited on top of the patterned wafer, followed by a flash sputtered layer of copper sufficient to form a seed layer for CVD deposition of copper metal from a volatile organic compound containing copper such as the trialkylphosphine (cyclopentadienyl) copper compound described in the Beach et al application, supra.

In accordance with this invention, a multi-chamber manufacturing system automatically processes a substrate having etched patterns to be filled with metallization. The system automatically loads the substrate onto a chuck in the first chamber. (That first chamber is suitable for loading and unloading.) The system evacuates gases from the chamber. In the next (RF clean) chamber, it plasma etches the substrate thereby cleaning it. The substrate is indexed to the next chamber (SPUT I) where the system deposits an adhesion layer on the substrate. The substrate is indexed to yet another chamber (SPUT II) where the system deposits a nucleation seed layer onto the substrate. It indexes to another (CVD) chamber where CVD copper is deposited. A reactor, adjacent to the CVD chamber, carries a sublimable precursor of the metal. A heat transfer system for the reactor provides selective cooling and heating of the reactor above and below the sublimation temperature of the precursor with the heating occurring for a predetermined period of sublimation time under programmed control by means of software in a data processing control system. The reactor is selectively connected to the chamber to transport sublimated gases into the chamber. The heated chuck heats the substrate conductively above the dissociation temperature of the precursor releasing the metal from the precursor onto the substrate to nucleate the metal species on the seed layer on the substrate. Subsequent to expiration of each predetermined period of sublimation time, the system is pumped to a lower pressure and the substrate indexed to the next chamber (load/unload), removed from the chuck and subsequently unloaded from the system.

DESCRIPTION OF THE PREFERRED EMBODIMENT

Figure 1:
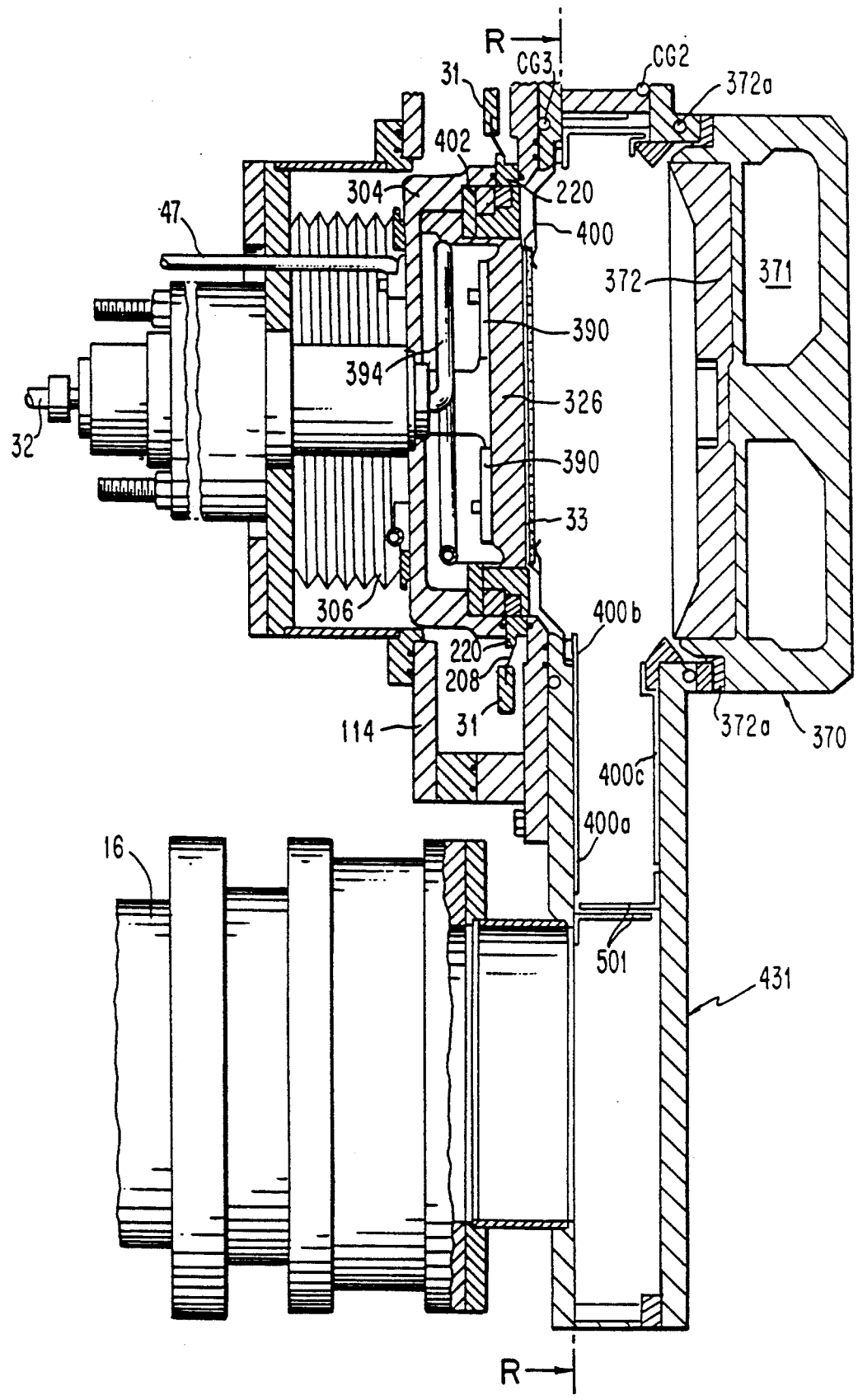
FIG. 1 shows an overall prior art sputtering system.

This invention is incorporated in a standard metal sputter module of an overall sputtering system such as an overall prior art MRC Eclipse system of FIG. 1. The overall system of FIG. 1 has been modified in FIG. 2 by removing the portions to the right of section line R—R including the sputter gun assembly (cathode assembly 370, cathode magnet 371, target 372) from the door assembly (431). The deposition shields (400-A,B,C), fixed throttle plates (501), wafer holder springs (33), and other internal chamber surfaces not intended to receive copper coating are composed at least on their exposed surfaces of native aluminum oxide or aluminum oxide coated for poor copper nucleation/adhesion. A stationary plenum 114, an index plate 31, cooling 47 for the seal cup, seal ring spring 208, seal ring 220, wafer holder 33, seal cup 304, bellows 306, back plane heater block 326, insulator 372a, electric heater 390, cooling tube 394, back plane shield 402, door 431, and cooling grooves CG are also provided.

The overall system includes a CVD subsystem 30 located at one of the index positions (CVD chamber) of the automatic processing system. In subsystem 30 CVD processing can be performed in a reactor chamber (24).

EXAMPLE

An example of a process performed on a wafer is as follows:
1. Automatic loading/unloading from/to a casette using standard wafer handling tooling.
2. RF CLEANING: Argon plasma etching with 13.5 Mhz RF power.
3. Adhesion/Barrier Layer-1000 Angstroms Ta/-TaO$_x$/Ta deposited using standard planar magnetron sputter deposition technique.
4. Seed layer-200 Angstroms Cu deposited using standard planar magnetron sputter deposition technique.
5. MOCVD Copper deposition process using system and method described below.

INITIALIZATION

Figure 2:
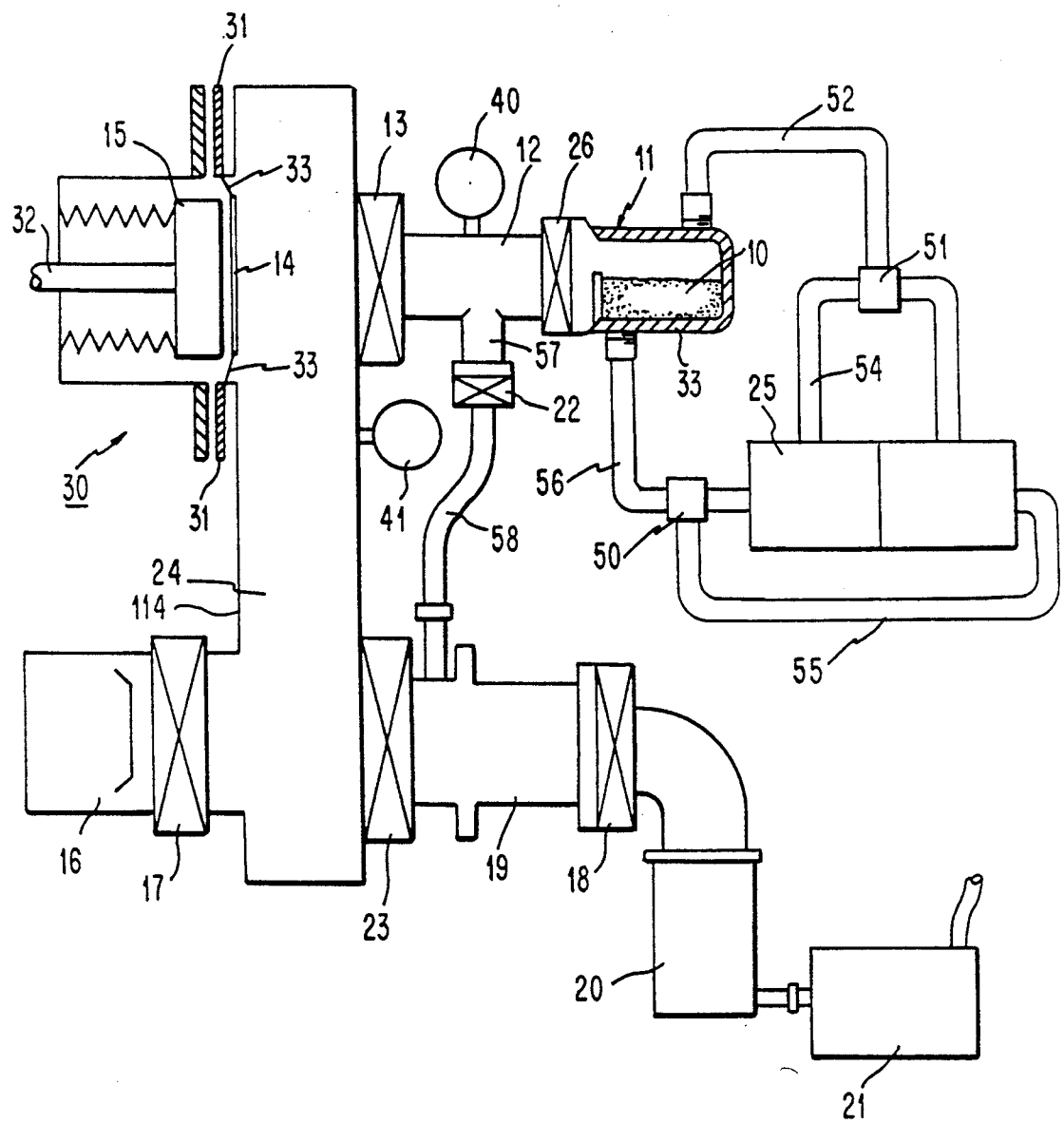
FIG. 2 shows an embodiment of this invention employing a portion of the overall system of FIG. I which has been modified in FIG. 2 by removing the portions to the right of section line R—R.

The precursor material 10 is loaded into the reactor 11 (offline). The reactor 11 is clamped to the subsystem 30 at the isolation valve 26. Glycol lines 52 and 56 are attached to reactor 11 as shown in FIG. 2. Reactor 11 is pumped down to a pressure of $10^{-4}$ Torr during a period of outgassing of precursor material 11. Mechanical pump 21 and turbo pump 20 are operating to perform this pump down. The isolation valve 26 is opened and the roughing valve 22 in roughing lines 57 and 58 is opened slowly. Transition chamber 12 and reactor 11 are pumped down to the vacuum set point by connection through the burn box/furnace 19 while throttle valve 18 is opened. At the vacuum set point, rough valve 22 and isolation valve 26 are closed. The system is now ready for deposition.

Step 1

A semiconductor wafer 14 held by fingers 33 on index plate 31 is preprocessed in load/unload, RF, SPUTI, SPUT II and indexed about the overall system until it is located over a wafer chuck 15.

Step 2

The wafer is seated upon chuck 15 by the standard automatic wafer handling mechanism. The chuck 15 is gas heated and includes tube 32 through which argon gas passes to transfer heat from chuck 15 to wafer 14 by convection as the argon gas flows across the back of the wafer 15, as is well understood by those skilled in the art of automatic wafer processing.

Step 3

Reactor chamber 24 is evacuated to the predetermined pressure set point of $10^{-6}$ Torr.

Step 4

Hot Glycol coolant in reservoir 25 is connected by a supply loop to the jacket 33 of reactor 11 to heat the precursor contained in reactor 11. An isolation valve 26 opens and a pressure transducer 40, in the form of a capacitive manometer, senses the sublimation of the precursor material from reactor 11.

Step 5

Deposition valve 13 opens under the control a the pressure transducer 40. Turbo pump valve 23 also opens under control of transducer 40. Throttle valve 18 opening is controlled by another pressure transducer 41. Throttle valve 18 controls the pressure in chamber 24, because it controls the pumping speed of turbo pump 20 and mechanical pump 21.

Step 6

Deposition Mode: Unreacted precursor is pumped through the "burn box/furnace" 19 for decomposition. Duration: time x- software.

Step 7

After the expiration of time X measured by the software, the functions occur as follows:
a. Deposition valve 13 closes; and there is a switch from hot to cold Glycol circulation through jacket 33.
b. Throttle valve 18 opens fully and chamber 24 is pumped to vacuum set point pressure of about $5 \times 10^{-4}$ Torr.
c. Turbo pump valve 23 closes.
d. Valve 17 to cryogenic pump 16 opens and the chamber 24 is pumped down to a lower pressure set point of between about $10^{-6}$ to $10^{-7}$ Torr.

Step 8

Wafer 14 is released from chuck 15 by the CPU software.

Step 9

Wafer 14 is indexed to the load/unload position in the automatic system.

The chamber (24 in FIG. 2) is modified to attach in line with the wafer 14: the reactor deposition valve 13 on which is attached a reducing tee transition chamber 12, the reactor 11, and reactor roughing valve 22; and opposite the cryo pump, a throttle valve 18, on which is attached a residual gas burn box 19, a chemical series turbo pump 20, foreline turbopump valve 23, and a chemical series mechanical vacuum pump 21.

The entire modified module, minus the reactor 11, the assemblies downstream of the throttle valve 19, 20, 21, 22, 23 and the cryo pump 16, will be held at constant temperature of plus five deg. centigrade above the temperature of reactor 11 during the process deposition cycle by enveloping the above module in a temperature controlled enclosure. The reactor temperature is controlled by a recirculating temperature controlled bath 25.

Wafer handling and processing is performed in automatic mode with programmable software for handling the assemblies on the CVD module. Automatic cassette-to-cassette wafer loading-unloading, in situ R.F. cleaning, sputter deposition of a metallic adhesion layer such as tantalum, sputter deposition of a copper seed layer, and CVD copper deposition with gas pressure and wafer temperature control (120° C. to 250° C.) will be the normal processing capability of this system.

PROCESS DESCRIPTION

A preprocessed wafer 14 with etched features (lines and/or vias) arrives the processing system in a cassette (not shown), which is loaded into the wafer handling portion of the system. When the electronic control system for the system issues a program start command the wafer is automatically unloaded from the cassette, oriented by notch and flat markers on the periphery of the wafer as is well known by those skilled in the art, and loaded into the load/unload chamber (chamber #1, not shown) where it is vacuum isolated and pumped to a preset vacuum pressure. When the program controller senses that all other process chambers have completed their cycles the system indexes the wafer into the next chamber (#2, not shown). Here the wafer is again vacuum isolated, pumped to a preset vacuum pressure and the entire surface of the wafer is cleaned by RF plasma etching. The time, pressure, and power levels of the cleaning are programmable. Present parameters are:
time—45 seconds,
pressure—5.7 microns,
power 1000V.

When the system senses that this and all other processes are completed, the wafer is indexed into the next chamber (#3).

In chamber 3 the wafer is again vacuum isolated, pumped to a preset vacuum pressure, heated, and then coated with a metal film (presently tantalum with an oxide insulator, or reactively sputtered with either nitrogen or oxygen for a polyimide insulator) serving as an adhesion layer to the insulator material and as an electromigration barrier. Preset parameters are:
heat—100° C.,
pressure 9.6 microns,
DC magnetron power 6.0 kw yielding 36 angstroms/second with a total film thickness of 1000 Angstroms. When this and the other processes are completed the wafer is indexed into the next chamber (#4).

In chamber 4, the wafer is again vacuum isolated, pumped to a preset vacuum pressure, heated, and a nucleation metal film layer of sputtered copper is applied. Preset parameters are:
temp—160° C.,
pressure—5.4 microns,
DC magnetron power of 5.0 kw yielding 250–300 Angstroms film thickness of sputtered copper. When this and the other processes are completed the wafer is indexed to the next chamber (#5).

The wafer 14 is again vacuum isolated in the CVD chamber 24 machined from a single piece of aluminum which is kept at a constant temperature of 80° C. and independently heated on the vacuum chuck 15. The precursor material (described in the Beach et al application supra) is in the reactor 11 having been kept cool by circulating Glycol from a temperature controlled bath 25 through the outer envelope of the reactor 11. As the wafer 14 is being heated the reactor temperature is raised by circulating heated Glycol (80° C.) from a second temperature-controlled bath through the outer envelope of the reactor. A baratron gage 40 in the transition chamber 12 with the isolation valve 26 open and roughing valve 22 open and the deposition valve 13 and turbo valve 23 closed senses sublimation of the precursor chemical compound which carries the copper taking place by the increase in vacuum pressure. Upon reaching a predetermined pressure set point in the reactor, the system calls for the deposition valve 13 (and turbo pump valve 23) to open giving the sublimed gas a free path to the wafer 14. Simultaneously the roughing valve 22 closes. Because the temperature of the wafer is the hottest part in the chamber (approximately 160°–250° C.) the precursor molecule dissociates and the copper bearing portion of the molecule nucleates and grows on the wafer surface with the remainder of the gasses flowing through the burn box 19 where they are consumed. Chamber pressure (at or about 20 microns) is controlled by adjustment of the throttle valve 18 during the deposition cycle. This process continues until timed out (with a copper film growth of from 1 to 1.5 microns or other appropriate thickness) when the deposition valve 13 and the isolation valve 26 close and the Glycol bath is switched to cold thus stopping the sublimation. The system continues to pump through the turbo pump 20 backed by a mech pump 21 until pressure set point (10E4) reached indicating residual gasses are consumed. At this time the turbo pump valve 23 closes, the cryo pump valve 17 opens and the system continues to be pumped by a cryo pump 16 to a lower vacuum pressure set point (10E5). Upon reaching this value the system senses the process is complete and the wafer indexes next to the load/unload chamber (not shown) where the wafer is unloaded and returns to its original position in the cassette from where it originated. This completes the wafer MOCVD copper deposition cycle.

The precursor is loaded into the reactor 11 by venting it and the transition chamber 12 to atmosphere with the isolation valve 26 open and all other valves closed. Initial reactor pumpdown through the roughing valve 22 causes initial outgas vapors to be consumed in the burn box 19.

The uniqueness of this system is its ability to perform MOCVD copper deposition as an integrated in situ process. No other system exists with this total process capability. What allows the modified Eclipse system to perform this process is the design of the CVD module and the incorporation of this module as part of a single wafer processing system. Several equipment manufacturers (Varian, Applied Materials, Eaton, Balzers) are in the process of designing this type of integrated process system.

What is claimed is:

1. An automatic manufacturing apparatus for processing a substrate having etched patterns to be filled with metallization comprising,
   a) a chamber, means for automatically loading said substrate onto a chuck in said chamber,
   b) means for evacuating gases from said chamber,
   c) means for plasma cleaning said substrate,
   d) means for depositing an adhesion layer of a first metal on said substrate and for depositing a nucleation layer of seeds of a second metal onto said substrate subsequent to evacuation of gases from said chamber,
   e) chemical vapor deposition reactor means carrying a sublimable precursor of said second metal, said reactor means being adjacent to said chamber,
   f) means for selectively connecting said chemical vapor deposition reactor means to said chamber whereby sublimated gases can be transported into said chamber, and
   g) chemical vapor deposition heating means for heating said substrate above the dissociation temperature of said precursor releasing said second metal from said precursor onto said substrate, whereby nucleation of said second metal species occurs on said seed locations on said substrate.

2. Apparatus in accordance with claim 1 including means for providing heat transfer selectively away from and to said reactor means for selectively cooling and heating said reactor means above and below the sublimation temperature of said precursor with said heating occurring for a predetermined period of sublimation time under the control of a programmable control means.

3. Apparatus in accordance with claim 1 including means for pumping said system to a lower pressure subsequent to expiration of each said predetermined period of sublimation time.

4. An automatic manufacturing apparatus for processing a substrate having etched patterns to be filled with metallization comprising,
   a) a chamber, means for evacuating gases from said chamber,
   b) means for plasma cleaning said substrate,
   c) means for depositing an adhesion layer of a first metal on said substrate and for depositing nucleation seeds of a second metal onto said substrate subsequent to evacuation of gases from said chamber,
   d) chemical vapor deposition reactor means carrying a sublimable precursor of said second metal, said reactor means being adjacent to said chamber,
   e) means for providing heat transfer selectively away from and to said reactor means for cooling and heating said reactor means above and below the sublimation temperature of said precursor with said heating occurring for a predetermined period of sublimation time under the control of a programmable means for timing,
   f) means for selectively connecting said reactor means to said chamber whereby sublimated gases can be transported into said chamber,
   g) chemical vapor deposition heating means connected to heat said chuck for heating said substrate above the dissociation temperature of said precursor releasing said second metal from said precursor onto said substrate, whereby nucleation of said second metal species occurs on said seed layer of said first metal on said substrate,
   h) means for pumping said system to a lower pressure subsequent to expiration of each said predetermined period of sublimation time, and
   i) means for unloading said substrate from said chuck and said chamber subsequently.

5. An automatic manufacturing system for processing a substrate having etched patterns to be filled with metallization comprising,
   a) a chamber,
   b) an exhaust system for evacuating gases from said chamber,
   c) sputter deposition apparatus for
      1) depositing an adhesion layer of a first metal on said substrate; and
      2) depositing a nucleation seed layer of a second metal onto said substrate subsequent to evacuation of gases from said chamber,
   d) a chemical vapor deposition reactor for subliming a precursor of said second metal, said reactor being adjacent to said chamber,
   e) a connector for selectively connecting said reactor means to said chamber for transportation of sublimated gases of said precursor of said second metal into said chamber,
   f) a temperature control system, said temperature control system being capable of heating said substrate above the dissociation temperature of said precursor releasing said second metal from said precursor onto said substrate during a period of sublimation time, whereby nucleation of said second metal species occurs in the locations of said seeds on said substrate.

6. Apparatus in accordance with claim 5 wherein a plasma cleaner or etcher is provided for plasma cleaning or etching said substrate prior to depositing a coating on said substrate.

7. Apparatus in accordance with claim 5, or 6 wherein said temperature control system provides heat transfer selectively to and from said reactor for selectively heating and cooling said reactor above and below the sublimation temperature of said precursor with said heating occurring for a predetermined period of sublimation time.

8. Apparatus in accordance with claim 5, 6, or 7 including a pump for pumping said system to a lower pressure subsequent to expiration of each said period of sublimation.

9. Apparatus in accordance with claim 5, 6, 7, or 8 including a loader for automatically loading said substrate into said chamber on a chuck.

10. Apparatus in accordance with claim 5, 6, 7, 8 or 9 including
   a) said temperature control system selectively cooling and heating said reactor above and below the sublimation temperature of said precursor with said heating occurring for a predetermined period of sublimation time,
   b) said temperature control system including
      i) a heat source for heating said substrate, and
      ii) means connected to heat said chuck for heating said substrate above the dissociation temperature of said precursor releasing said metal from said precursor onto to said substrate,
   whereby nucleation of said metal species occurs in the seed layer locations on said substrate, and
   c) means for unloading said substrate from said chuck and said chamber subsequently.

11. Apparatus in accordance with claim 7 including
   a) a pumping system for pumping said system to a lower pressure subsequent to expiration of each said predetermined period of sublimation time, and
   b) means for unloading said substrate from said chuck and said chamber subsequently.

12. Apparatus in accordance with claim 9 including
   a) a pumping system for pumping said system to a lower pressure subsequent to expiration of each said period of sublimation time, and
   b) said loader unloading said substrate from said chuck and said chamber subsequently.

13. Apparatus in accordance with claim 5, 6, 7, 8 or 12 including means for unloading said substrate from said chuck and said chamber subsequently.

14. Apparatus in accordance with claim 5, 6, 7, 8, 9, 11, 12 or 13 wherein a predetermined program automatically controls the sequence of operations of said apparatus.

15. An automatic manufacturing system for processing a substrate having etched patterns to be filled with metallization comprising,
   a) a chamber,
   b) a loader for automatically loading said substrate into said chamber on a chuck,
   c) an exhaust system for evacuating gases from said chamber,
   d) a plasma cleaner or etcher providing plasma cleaning or etching of said substrate prior to depositing a coating on said substrate,
   e) coating means for depositing an adhesion layer of a first metal on said substrate prior to depositing a nucleation seed layer of a second metal thereon,
   f) coating apparatus for depositing said nucleation seed layer of said second metal onto said substrate subsequent to evacuation of gases from said chamber,
   g) a chemical vapor deposition reactor for subliming a precursor of said second metal, said reactor being adjacent to said chamber,
   h) a connector for selectively connecting said reactor means to said chamber whereby sublimated gases are transported into said chamber,
   i) a temperature control system including:
      (1) chemical vapor deposition heating means for heating connected to said chuck for heating said substrate above the dissociation temperature of said precursor releasing for said metal from said precursor onto said substrate during a period of sublimation time, whereby nucleation of said metal species occurs in the locations of said seeds on said substrate,
      (2) means for providing heat transfer selectively to and from said reactor for selectively heating and cooling said reactor above and below the sublimation temperature of said precursor with said heating occurring for a predetermined period of sublimation time,
   j) a pumping system for pumping said system to a lower pressure subsequent to expiration of each said predetermined period of sublimation time, and
   k) means for unloading said substrate from said chuck and said chamber subsequently, and
   l) means comprising a predetermined program for automatically controlling the sequence of operations of said apparatus.

16. An automatic manufacturing system for processing a substrate having etched patterns to be filled with metallization comprising,
   a) a chamber,
   b) a loader for automatically loading said substrate into said chamber on a chuck,
   c) an exhaust system for evacuating gases from said chamber,
   d) an RF plasma etcher providing plasma etching of said substrate prior to depositing a coating on said substrate for a time of about 45 seconds at a pressure of about 5.7 microns with a power of about 1000 Volts,
   e) coating means for depositing an adhesion layer of a tantalum metal on said substrate prior to depositing a nucleation seed layer of a copper thereon, said adhesion layer being deposited at a temperature of about 100° C., a pressure of about 9.6 microns, and DC magnetron power of about 6 kw at a rate of about 36 Å/sec. with a total film thickness of about 1000 Å,
   f) coating apparatus for sputtering said nucleation seed layer of copper onto said substrate subsequent to evacuation of gases from said chamber to a predetermined vacuum, at a temperature of about 160° C., a pressure of about 5.4 microns, and DC magnetron power of about 5 kw, with a total film thickness of from about 250 Å and about 300 Å,
   g) a reactor for subliming a precursor of copper comprising trialkylphosphine (cyclopentadienyl) copper, said reactor being adjacent to said chamber by raising the temperature of said reactor to about 80° C., h) a connector for selectively connecting said reactor means to said chamber whereby sublimated gases are transported into said chamber, i) a temperature control system including:
  (1) chemical vapor deposition heating means for heating connected to said chuck for heating said substrate to a temperature above the dissociation temperature of said precursor releasing for said metal from said precursor onto said substrate, said temperature of said substrate being from about 160° C. to about 250° C. during a period of sublimation time, whereby nucleation of said metal species occurs in the locations of said seeds on said substrate,
  (2) means for providing heat transfer selectively to and from said reactor for selectively heating and cooling said reactor above and below the sublimation temperature of said precursor with said heating occurring for a predetermined period of sublimation time, j) a pumping system for pumping said system to a lower pressure subsequent to expiration of each said predetermined period of sublimation time, k) means for unloading said substrate from said chuck and said chamber subsequently, and l) means comprising a predetermined program for automatically controlling the sequence of operations of said apparatus.

* * * * *